(12) United States Patent  
Yamazaki et al.

(10) Patent No.: US 8,830,661 B2
(45) Date of Patent: Sep. 9, 2014

(54) PORTABLE ELECTRONIC DEVICE

(75) Inventors: Shunpei Yamazaki, Setagaya (JP); Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 146 days.

(21) Appl. No.: 13/005,775

(22) Filed: Jan. 13, 2011

(65) Prior Publication Data

US 2011/0176263 A1    Jul. 21, 2011

(30) Foreign Application Priority Data

Jan. 20, 2010    (JP) .................................. 2010-010382

(51) Int. Cl.
*H05K 7/00*    (2006.01)
*G06F 1/26*    (2006.01)

(52) U.S. Cl.
CPC ....................................... *G06F 1/263* (2013.01)
USPC ................................. 361/679.01; 361/679.21

(58) Field of Classification Search
USPC ....................... 361/679.01, 784, 748; 320/108
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,548,830 B1 * | 4/2003 | Noguchi et al. | ................. 257/66 |
| 6,563,174 B2 | 5/2003 | Kawasaki et al. | |
| 6,577,531 B2 | 6/2003 | Kato | |
| 6,646,288 B2 * | 11/2003 | Yamazaki et al. | .............. 257/72 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

(Continued)

*Primary Examiner* — Jayprakash N Gandhi
*Assistant Examiner* — Mukund G Patel
(74) *Attorney, Agent, or Firm* — Eric J. Robinson; Robinson Intellectual Property Law Office, P.C.

(57) ABSTRACT

A portable electronic device that can operate even when electric power supplied through contactless charge by electromagnetic induction is low is provided. The portable electronic device includes a reflective liquid crystal display which includes a transistor including an oxide semiconductor, a power source portion which includes a rechargeable battery capable of charge by contactless charge, and a signal processing portion which includes a nonvolatile semiconductor memory device. In the portable electronic device, electric power stored in the rechargeable battery is used in the reflective liquid crystal display and the signal processing portion.

21 Claims, 10 Drawing Sheets

(56) References Cited

U.S. PATENT DOCUMENTS

| | | | |
|---|---|---|---|
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,339,820 B2 | 3/2008 | Kato | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,492,361 B2* | 2/2009 | Kawachi et al. | 345/204 |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,935,582 B2 | 5/2011 | Iwasaki | |
| 8,391,060 B2 | 3/2013 | Kato | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0033104 A1* | 2/2006 | Nakazaki et al. | 257/64 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0272922 A1 | 11/2007 | Kim et al. | |
| 2007/1025292 | 11/2007 | Ito et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1* | 3/2008 | Iwasaki | 257/79 |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0158217 A1 | 7/2008 | Hata et al. | |
| 2008/0166834 A1 | 7/2008 | Kim et al. | |
| 2008/0182358 A1 | 7/2008 | Cowdery-Corvan et al. | |
| 2008/0211800 A1 | 9/2008 | Arasawa et al. | |
| 2008/0224133 A1 | 9/2008 | Park et al. | |
| 2008/0252254 A1* | 10/2008 | Osada | 320/108 |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0045397 A1 | 2/2009 | Iwasaki | |
| 2009/0054110 A1* | 2/2009 | Tseng | 455/573 |
| 2009/0068773 A1 | 3/2009 | Lai et al. | |
| 2009/0072232 A1* | 3/2009 | Hayashi et al. | 257/43 |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0152627 A1 | 6/2009 | Tanaka et al. | |
| 2009/0194769 A1* | 8/2009 | Hiramatsu et al. | 257/66 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2010/0276689 A1 | 11/2010 | Iwasaki | |
| 2010/0279462 A1 | 11/2010 | Iwasaki | |

FOREIGN PATENT DOCUMENTS

| | | | |
|---|---|---|---|
| JP | 60-198861 A | 10/1985 | |
| JP | 62-230043 A | 10/1987 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-043447 A | 2/2002 | |
| JP | 2002-076356 A | 3/2002 | |
| JP | 2002-093924 A | 3/2002 | |
| JP | 2002093924 * | 3/2002 | G11C 11/402 |
| JP | 2002-197856 A | 7/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006-018132 | 1/2006 | |
| JP | 2007-147871 A | 6/2007 | |
| JP | 2008-164794 A | 7/2008 | |
| JP | 2008-181108 A | 8/2008 | |
| JP | 2009-152235 A | 7/2009 | |
| JP | 2009-165226 A | 7/2009 | |
| JP | 2010-003910 A | 1/2010 | |
| WO | WO-2004/114391 | 12/2004 | |
| WO | WO-2007/029844 | 3/2007 | |

OTHER PUBLICATIONS

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.

(56) References Cited

OTHER PUBLICATIONS

International Search Report (Application No. PCT/JP2010/073890) Dated Apr. 12, 2011.

Written Opinion (Application No. PCT/JP2010/073890) Dated Apr. 12, 2011.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Plase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID , 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs with a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,$YbFe_2O_4$, and $Yb_2Fe_3O_7$ Types of Structures for Compounds in the $In_2O_3$ and $Sc_2O_3$—$A_2O_3$—BO Systems [A; Fe, Ga, or Al; B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent $InGaZnO4$,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide $InGaO3(ZnO)m$ (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on $SrTiO3$ With Sputtered $Al2O3$ Gate Insulator,", Appl. Phys. Lett. (Applied Physics Letters) , Sep. 1, 2003, vol. 83, No. 9, pp. 1755-1757.

\* cited by examiner

PORTABLE ELECTRONIC DEVICE

BACKGROUND OF THE INVENTION

1. Field of the Invention

The technical field of the present invention relates to a portable electronic device capable of contactless charge.

2. Description of the Related Art

Portable electronic devices such as e-book readers that enable reading by displaying computerized book data on a display have been spread. Such devices are assumed to be used portably, and can be driven by batteries incorporated in main bodies. Therefore, these devices are preferably supplied with electric power by using an external power supply device.

In Patent Document 1, an e-book reader supplied with power supply voltage by using an AC adapter is suggested.

In Patent Document 2, a display device is suggested. The display device includes a display portion, a console portion for operation and input from external, an antenna portion for transmitting and receiving a wireless signal, a controller portion for controlling a signal that is input in the console portion and a signal that is transmitted and received by the antenna portion, and a battery portion for converting a wireless signal received by the antenna portion into electric power and for storing it as electric power for driving the display portion.

REFERENCE

Patent Document

[Patent Document 1] Japanese Published Patent Application No. 2007-147871
[Patent Document 2] Japanese Published Patent Application No. 2008-181108

SUMMARY OF THE INVENTION

In order to supply power supply voltage from an AC adapter, a contact such as a metal electrode needs to be provided on a portable electronic device side. The contact needs durability. In addition, it is necessary to take measures against contact failure or generation of leakage due to short circuit, moisture, or the like.

In addition, in order that a portable electronic device can operate even when electric power supplied through contactless charge by electromagnetic induction is low, power consumption of the portable electronic device needs to be reduced.

An object of one embodiment of the present invention is to provide a portable electronic device that can operate even when electric power supplied through contactless charge by electromagnetic induction is low.

One embodiment of the present invention is a portable electronic device including a reflective liquid crystal display, a power source portion, and a signal processing portion. The reflective liquid crystal display includes a transistor including an oxide semiconductor, the power source portion includes a rechargeable battery capable of charge by contactless charge, and the signal processing portion includes a nonvolatile semiconductor memory device.

Another embodiment of the present invention is a portable electronic device including a reflective liquid crystal display, a power source portion, and a nonvolatile semiconductor memory device. The reflective liquid crystal display includes a first transistor including a first oxide semiconductor, the power source portion includes a rechargeable battery capable of charge by contactless charge, and the nonvolatile semiconductor memory device includes a second transistor, a third transistor, and a capacitor. A first terminal of the second transistor is electrically connected to a first wiring, a second terminal of the second transistor is electrically connected to a second wiring, and a gate of the second transistor is electrically connected to a first terminal of the third transistor and one electrode of the capacitor. A second terminal of the third transistor is electrically connected to a third wiring, and a gate of the third transistor is electrically connected to a fourth wiring. The other electrode of the capacitor is electrically connected to a fifth wiring.

The third transistor may be a transistor including a second oxide semiconductor. The second oxide semiconductor may be the same as the first oxide semiconductor or different from the first oxide semiconductor.

Electric power stored in the rechargeable battery may be used in the reflective liquid crystal display and the signal processing portion.

The power source portion may include a solar cell.

The oxide semiconductor is intrinsic or substantially intrinsic, and the off-state current per unit channel width of a transistor is lower than or equal to 100 aA/μm ("a" is $10^{-18}$), preferably lower than or equal to 1 aA/μm, more preferably lower than or equal to 1 zA/μm ("z" is $10^{-21}$) at room temperature. Note that in this specification, "intrinsic" means the state of a semiconductor with a carrier concentration of lower than $1 \times 10^{12}/cm^3$, and "substantially intrinsic" means the state of a semiconductor with a carrier concentration of higher than or equal to $1 \times 10^{12}/cm^3$ and lower than $1 \times 10^{14}/cm^3$.

Since contactless charge can be performed, a contact such as a metal terminal on a portable electronic device side does not need to be provided. In addition, a portable electronic device that can operate even when electric power supplied through contactless charge by electromagnetic induction is low can be provided.

DETAILED DESCRIPTION OF THE INVENTION

Embodiments of the invention disclosed herein will be described below with reference to the drawings. Note that the invention is not limited to the following description, and those skilled in the art can easily understand that modes and details of the invention can be changed in various ways without departing from the purpose and the scope of the invention. Accordingly, the invention should not be interpreted as being limited to the following description of the embodiments.

Embodiment 1

In this embodiment, a structure of hardware of a portable electronic device of this embodiment is described with reference to FIG. 1, FIG. 2, FIG. 3, and FIGS. 4A to 4C.

Figure 1:
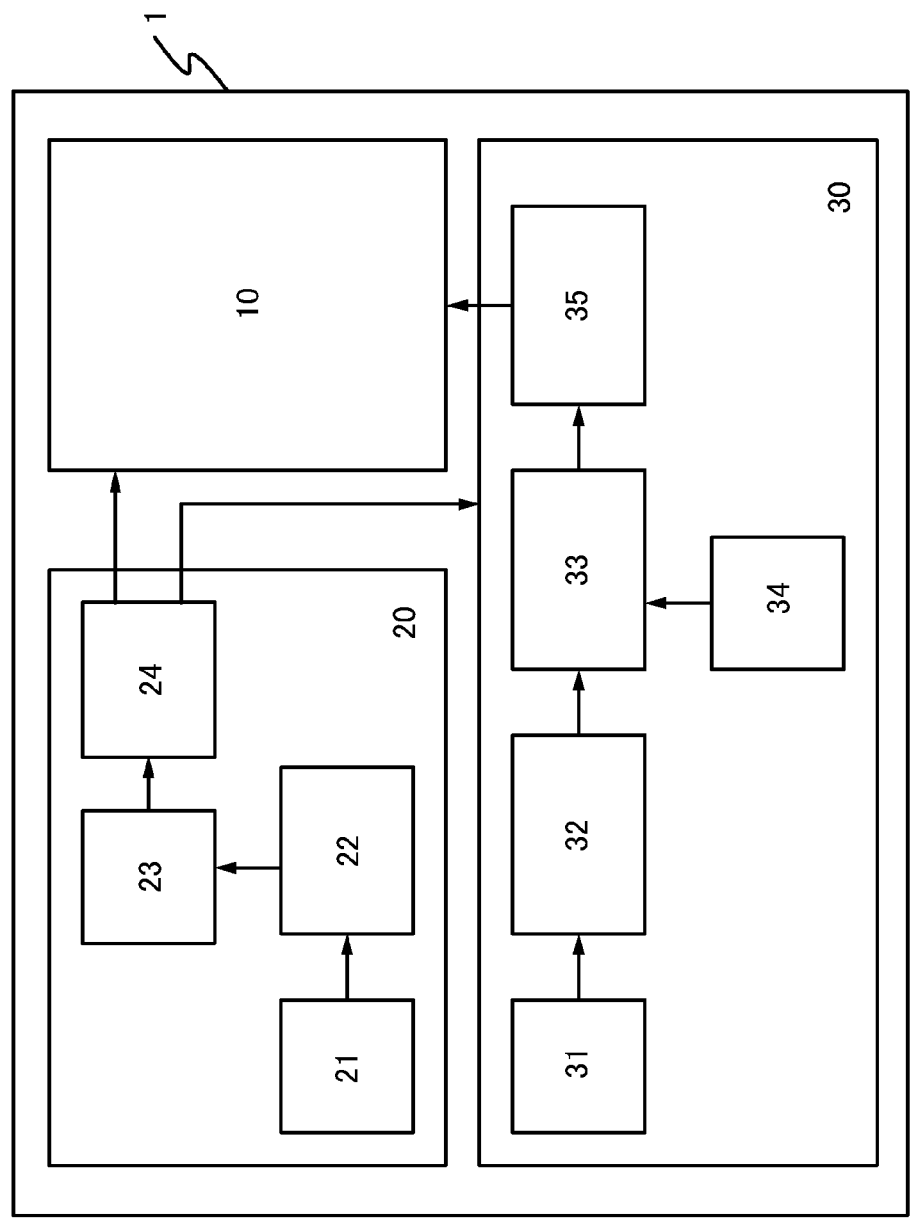
FIG. 1 is a block diagram of a portable electronic device.

FIG. 1 is the block diagram of the portable electronic device of this embodiment. A portable electronic device 1 includes a display 10, a power source portion 20, and a signal processing portion 30. Note that an example in which the portable electronic device 1 is used as an e-book reader (also referred to as an e-book terminal device) is described below.

(Power Source Portion 20)

The power source portion 20 includes an antenna 21, a rectifier circuit 22, a rechargeable battery 23, and a DC-DC converter 24.

(Antenna 21)

The antenna 21 is a power-receiving coil for contactless charge.

Figure 2:
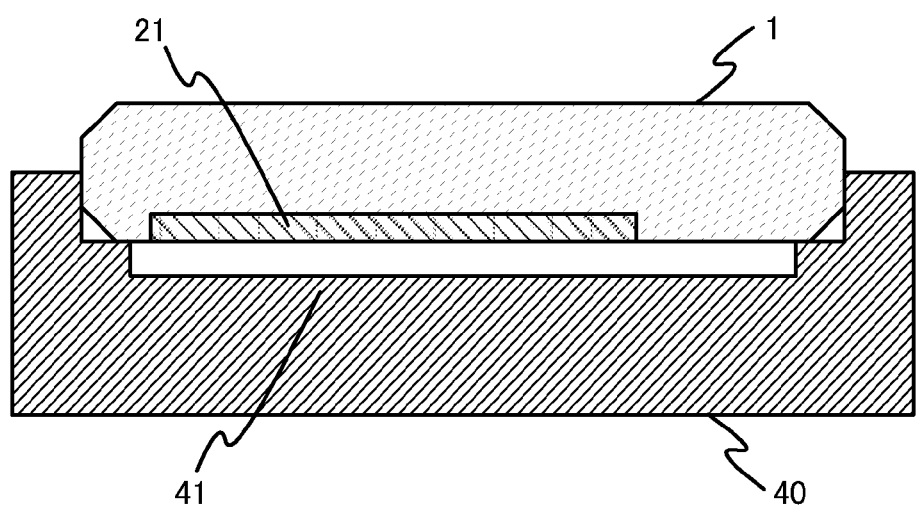
FIG. 2 is a drawing of a structure example of the portable electronic device and a battery charger.

In FIG. 2, a structure example of the portable electronic device and a battery charger are illustrated. As illustrated in FIG. 2, the portable electronic device 1 includes the antenna 21, and a battery charger 40 includes a power-sending coil 41. The contactless charge is performed by contactless transmission of electric power by electromagnetic induction between the coils, and a metal terminal is not provided between the coils.

The contactless charge does not need a contact such as a metal terminal for charging between the portable electronic device 1 and the battery charger 40. Therefore, there is no contact failure. Alternatively, leakage or the like due to short circuit, moisture, or the like hardly occurs.

(Rectifier Circuit 22)

Electric power received by the antenna 21 is rectified in the rectifier circuit 22 and is stored in the rechargeable battery 23.

(Rechargeable Battery 23)

The rechargeable battery 23 is a capacitor that can store electricity by charging and can be used repeatedly as a battery. As the rechargeable battery 23, for example, a lithium ion battery, a lithium ion capacitor, or the like can be used. In addition, the rechargeable battery 23 includes a control circuit for preventing overcharge and overdischarge.

(DC-DC Converter 24)

Electric power stored in the rechargeable battery 23 is transmitted to the display 10 and the signal processing portion 30 via the DC-DC converter 24 and is used as power supply voltage therein.

(Signal Processing Portion 30)

The signal processing portion 30 includes an antenna 31, a down converter 32, a signal processing circuit 33, an NVM (a nonvolatile memory) 34, and a display controller 35.

(Antenna 31)

The antenna 31 transmits a request for starting download of computerized book data (referred to as "e-book data" below) which is selected by a user of the portable electronic device 1 to a server, and receives the e-book data sent from the server in response to the request.

(Down Converter 32 and Signal Processing Circuit 33)

The e-book data received by the antenna 31 is down-converted in the down converter 32 and converted into a baseband signal. The baseband signal is processed in the signal processing circuit 33.

(NVM 34)

Since the amount of the e-book data received by the antenna 31 is larger than that of data for one screen of the display, the received data is stored in the NVM 34.

Here, an example of the structure of a circuit of a nonvolatile semiconductor memory device that can be applied to the NVM 34 is described with reference to FIG. 3.

Figure 3:
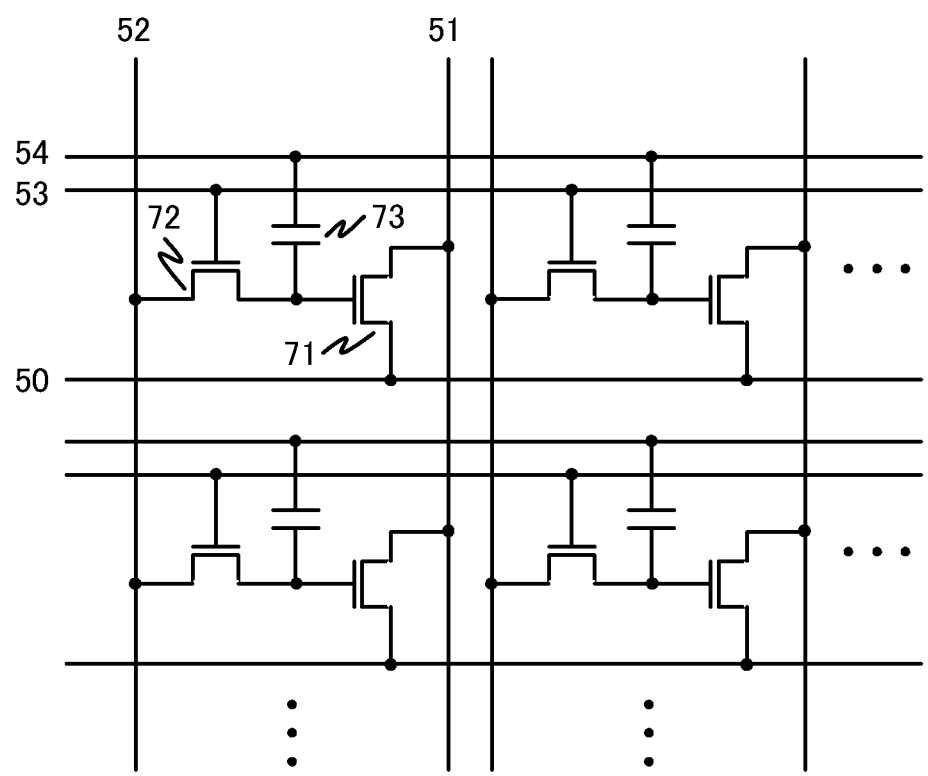
FIG. 3 is a diagram of an example of a circuit structure of a nonvolatile semiconductor memory device.

A nonvolatile semiconductor memory device illustrated in FIG. 3 includes a transistor 71, a transistor 72, and a capacitor 73.

A transistor including a material other than an oxide semiconductor is suitable for the transistor 71. Examples of the material other than the oxide semiconductor include single crystal silicon, crystalline silicon, and the like. The transistor including the material other than the oxide semiconductor can operate at high speed, so that data can be read from the nonvolatile semiconductor memory device at high speed.

In contrast, a transistor including an oxide semiconductor is suitable for the transistor 72. A transistor including an oxide semiconductor has a characteristic of extremely low off-state current. Thus, data stored in the nonvolatile semiconductor memory device can be retained for a long time. Therefore, refresh operation is unnecessary or performed less often, and power consumption of the nonvolatile semiconductor memory device can be reduced.

A gate of the transistor 71 is connected to one of a source and a drain of the transistor 72, a source of the transistor 71 is connected to a wiring 50 (a source line), and a drain of the transistor 71 is connected to a wiring 51 (a bit line). The other of the source and the drain of the transistor 72 is connected to a wiring 52 (a first signal line), and a gate of the transistor 72 is connected to a wiring 53 (a second signal line). In addition, one electrode of the capacitor 73 is connected to the gate of the transistor 71 and the one of the source and the drain of the transistor 72, and the other electrode of the capacitor 73 is connected to a wiring 54 (a word line).

Next, data write operation to the nonvolatile semiconductor memory device illustrated in FIG. 3 is described.

First, voltage is applied to the gate of the transistor 72, which is connected to the wiring 53, so that the transistor 72 is turned on. As a result, the wiring 52 and the transistor 71 are brought into conduction, and voltage is applied to the gate of the transistor 71 and the capacitor 73, so that data is written.

After that, the transistor 72 is turned off, so that the voltage applied to the gate of the transistor 71 is held and the data is stored. At this time, when a voltage at which the transistor 71 is turned on is applied to the gate of the transistor 71, the on state of the transistor 71 is held for a long time. In contrast, when a voltage at which the transistor 71 is turned off is applied to the gate of the transistor 71, the off state of the transistor 71 is held for a long time.

Next, data read operation from the nonvolatile semiconductor memory device illustrated in FIG. 3 is described.

In the case of the on or off state of the transistor 71, a constant voltage is applied to the wiring 50 and a read voltage is applied to the wiring 54. As a result, in the case where the transistor 71 is on, the voltage of the wiring 51 varies. In contrast, in the case where the transistor 71 is off, the voltage of the wiring 51 does not vary. Therefore, by comparing the voltages between the wiring 50 and the wiring 51, the data stored in the nonvolatile semiconductor memory device can be read.

Data rewrite operation to the nonvolatile semiconductor memory device illustrated in FIG. 3 is similar to the data write operation.

(Display Controller 35)

The display controller 35 transmits data whose content is to be displayed on the display 10.

Most of the e-book data is still-image data; thus, the data rewrite speed does not need to be very high. Accordingly, high-speed operation of the down converter 32, the signal processing circuit 33, the NVM 34, and the display controller 35 is not required. Therefore, these circuits can be driven with a low voltage. Thus, even when electric power supplied through contactless charge by electromagnetic induction is low, the portable electric device 1 can operate.

(Display 10)

The display 10 displays content of the e-book data. Note that with the use of a display that does not emit light by itself, such as a reflective liquid crystal display or an electrophoretic display, power consumption of the display 10 can be set to 10 mW or less. Thus, even when electric power supplied through contactless charge by electromagnetic induction is low, the portable electric device 1 can operate.

Here, an example of a circuit structure that can be applied to a display is described with reference to FIGS. 4A and 4B.

Figure 4A:
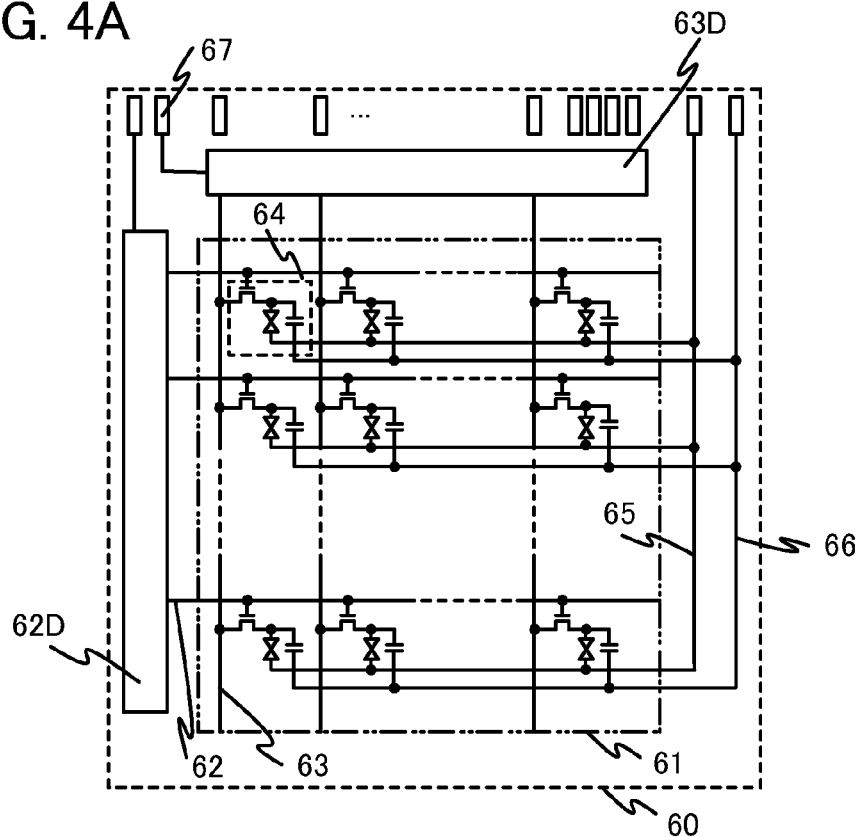
FIGS. 4A and 4B are schematic views of an example of a display panel of a liquid crystal display device.

FIG. 4A is a schematic view of an example of a display panel of a liquid crystal display device. A display panel 60 includes a pixel portion 61, a gate signal line 62, a gate signal line driver circuit 62D, a data signal line 63, a data signal line driver circuit 63D, a pixel 64, a common electrode 65, a capacitor line 66, and a terminal portion 67.

Figure 4B:
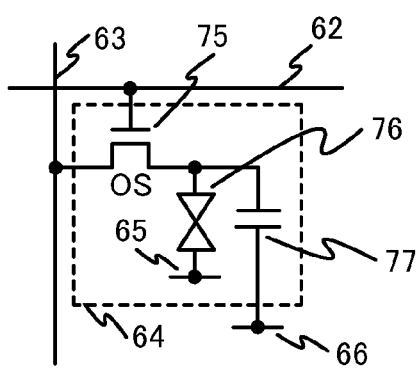

FIG. 4B is a view of the pixel 64 illustrated in FIG. 4A. The pixel 64 includes a transistor 75 including an oxide semiconductor, a liquid crystal element 76, and a storage capacitor 77.

Figure 4C:
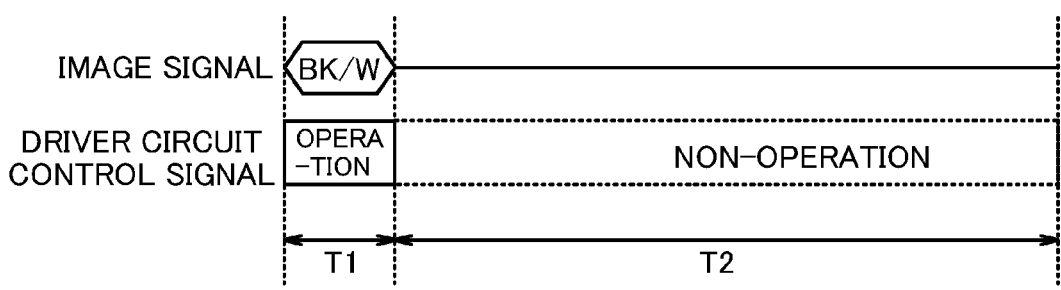
FIG. 4C is a chart of an example of a method for driving the display panel.

Next, an example of a method for driving the display panel is described with reference to FIG. 4C.

First, in order to write an image signal BK/W to the pixel, the transistor 75 is turned on, and a period T (hereinafter referred to as a "writing period T1") during which a voltage based on the image signal is applied to a pixel electrode of the liquid crystal element 76 is provided. In the writing period T1, a driver circuit control signal is supplied to a driver circuit of the display 10 and the display controller 35, so that these circuits operate.

After the writing period T1, voltage $V_{pix}$ is generated in the pixel electrode of the liquid crystal element 76. Then, the transistor 75 is turned off, so that the voltage $V_{pix}$ is held in the pixel electrode of the liquid crystal element 76.

In a subsequent period T2 (hereinafter referred to as a "holding period T2") during which the voltage $V_{pix}$ is held in the pixel electrode of the liquid crystal element 76, the image signal BK/W is not written. In addition, the driver circuit control signal is not supplied to the driver circuit of the display 10 and the display controller 35, so that these circuits do not operate.

The length of the holding period T2 varies depending on an off-state current $I_{75}$ of the transistor 75 and a current $I_{76}$ flowing through the liquid crystal element 76. In order to prevent a screen flicker due to variation in these currents, refresh operation by which data displayed on the screen is rewritten at regular intervals is necessary.

Note that the off-state current $I_{75}$ of the transistor 75 including an oxide semiconductor is extremely low. Therefore, the length of the holding period T2 is dependent only on the current $I_{76}$ flowing in the liquid crystal element 76. Thus, the number of rewrite operation of data to be displayed on the screen can be approximately 1/1000 the number of general rewrite operation (60 times per second).

As described above, in the holding period T2, the operation of the driver circuit of the display 10 and the display controller 35 can be stopped. Thus, power consumption of the display 10 and the display controller 35 can be approximately 1/1000 general power consumption.

Next, the oxide semiconductor included in the transistor is described.

Impurities such as hydrogen, moisture, hydroxyl group, or hydroxide (also referred to as a hydrogen compound) which serve as donors are intentionally removed from the oxide semiconductor included in the transistor, and then oxygen which is simultaneously reduced in the step of removing these impurities is supplied, so that the oxide semiconductor is highly purified and becomes electrically i-type (intrinsic). This is for suppressing variation in electric characteristics of the transistor.

Hydrogen contained in the oxide semiconductor is removed as much as possible; thus, the carrier density of the oxide semiconductor is less than $1\times10^{14}/cm^3$, preferably less than $1\times10^{12}/cm^3$, or more preferably less than $1\times10^{10}/cm^3$.

In an oxide semiconductor, which is a wide band gap semiconductor, the density of the minority carrier is low and the minority carrier is difficult to be induced. Thus, in the transistor including the oxide semiconductor, tunnel current is difficult to be generated; consequently, off-state current is difficult to flow.

In addition, impact ionization and avalanche breakdown are less likely to occur in the transistor including the oxide semiconductor, which is a wide band gap semiconductor. Therefore, the transistor including the oxide semiconductor has resistance to hot carrier deterioration. The hot carrier deterioration is mainly caused by an increase in the number of carriers due to avalanche breakdown and by injection of the carriers accelerated to high speed to the gate insulating film.

Note that the "off-state current" in this specification means current flowing between a source and a drain of an n-channel transistor with positive threshold voltage (Vth) when a given gate voltage of higher than or equal to −20 V and lower than or equal to −5 V is applied at room temperature. Note also that "room temperature" is higher than or equal to 15° C. and lower than or equal to 25° C.

The transistor including the oxide semiconductor disclosed in this specification has a current value per micrometer channel width (1 μm) of 100 aA/μm or less, preferably 1 aA/μm or less, more preferably 10 zA/μm or less at room temperature.

As described above, by using an oxide semiconductor that is highly purified and becomes electrically i-type (intrinsic), a transistor with an extremely small off-state current value can be provided. A test element group (also referred to as a TEG) is manufactured and the measurement results of off-state current characteristics are described below.

In the TEG, two hundred transistors each with L/W=3 μm/50 μm (the thickness d was 30 nm) are connected in parallel to provide a transistor with L/W=3 μm/10000 μm. Note that W represents the channel width and L represents the channel length.

Figure 10:
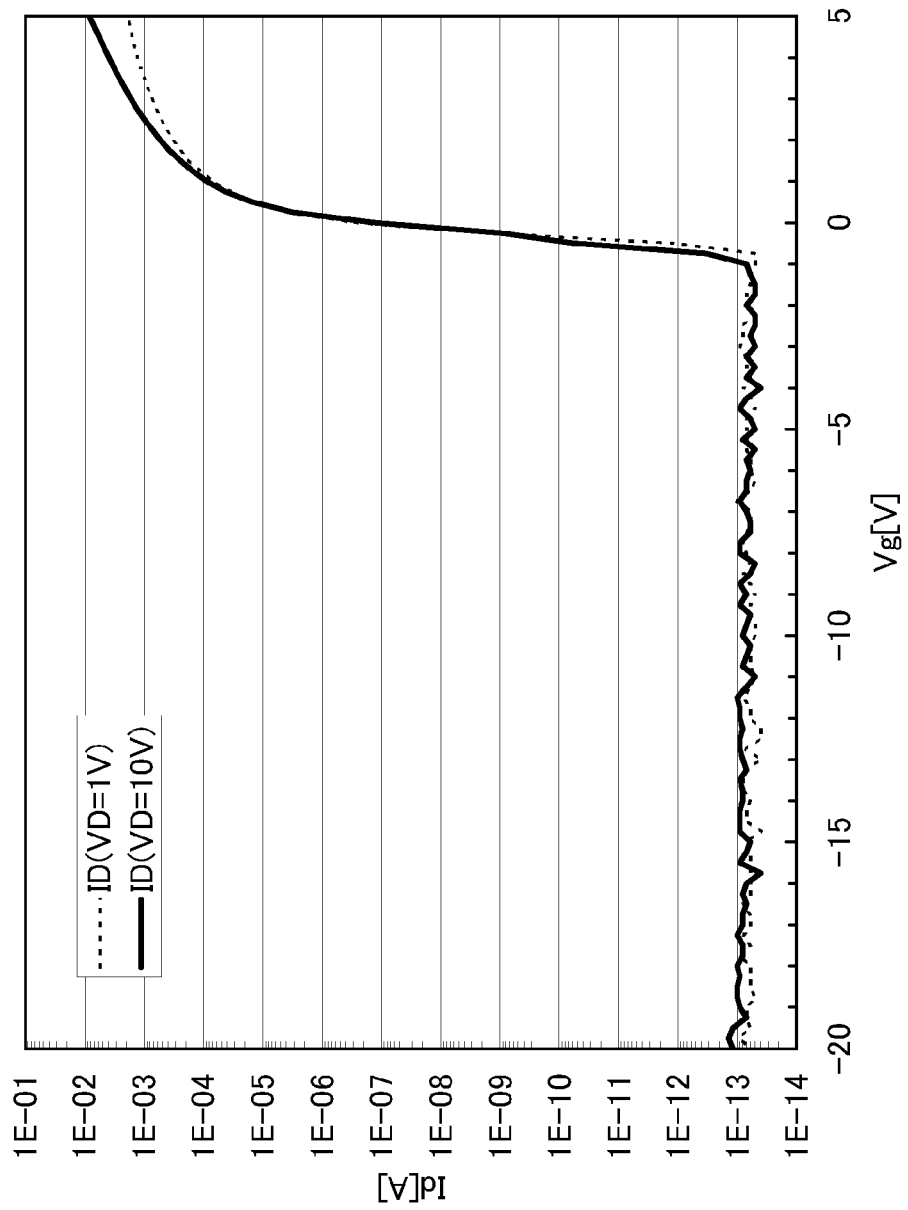
FIG. 10 is a graph showing electric characteristics of transistors.

FIG. 10 is a graph showing electric characteristics (log $(I_d)$–$V_g$) of the transistors provided in the TEG In FIG. 10, the horizontal axis represents gate voltage $V_g$ [V], and the vertical axis represents drain current $I_d$ [A]. Note that the substrate temperature was room temperature, and the voltage $V_d$ between a source and a drain was either 1 V (a dotted line in the graph) or 10 V (a solid line in the graph). In the above condition, the voltage $V_g$ between the source and the gate was varied from −20 V to +20 V, and transfer characteristics of the drain current $I_d$ were measured.

As shown in FIG. 10, the off-state current value of the transistor with a channel width W of 10000 μm was $1\times10^{-13}$ A or less when $V_d$ was 1 V or 10 V. This value is less than or equal to the resolution (100 fA) of a measurement device (a semiconductor parameter analyzer, Agilent 4156C manufactured by Agilent Technologies, Inc.). This off-state current value corresponds to 10 aA/μm per micrometer channel width (1 μm).

Embodiment 2

In this embodiment, a structure of hardware of a portable electronic device which is different from the structure of hardware of the portable electronic device of Embodiment 1 is described with reference to FIG. 5, FIG. 6, and FIG. 7.

Figure 5:
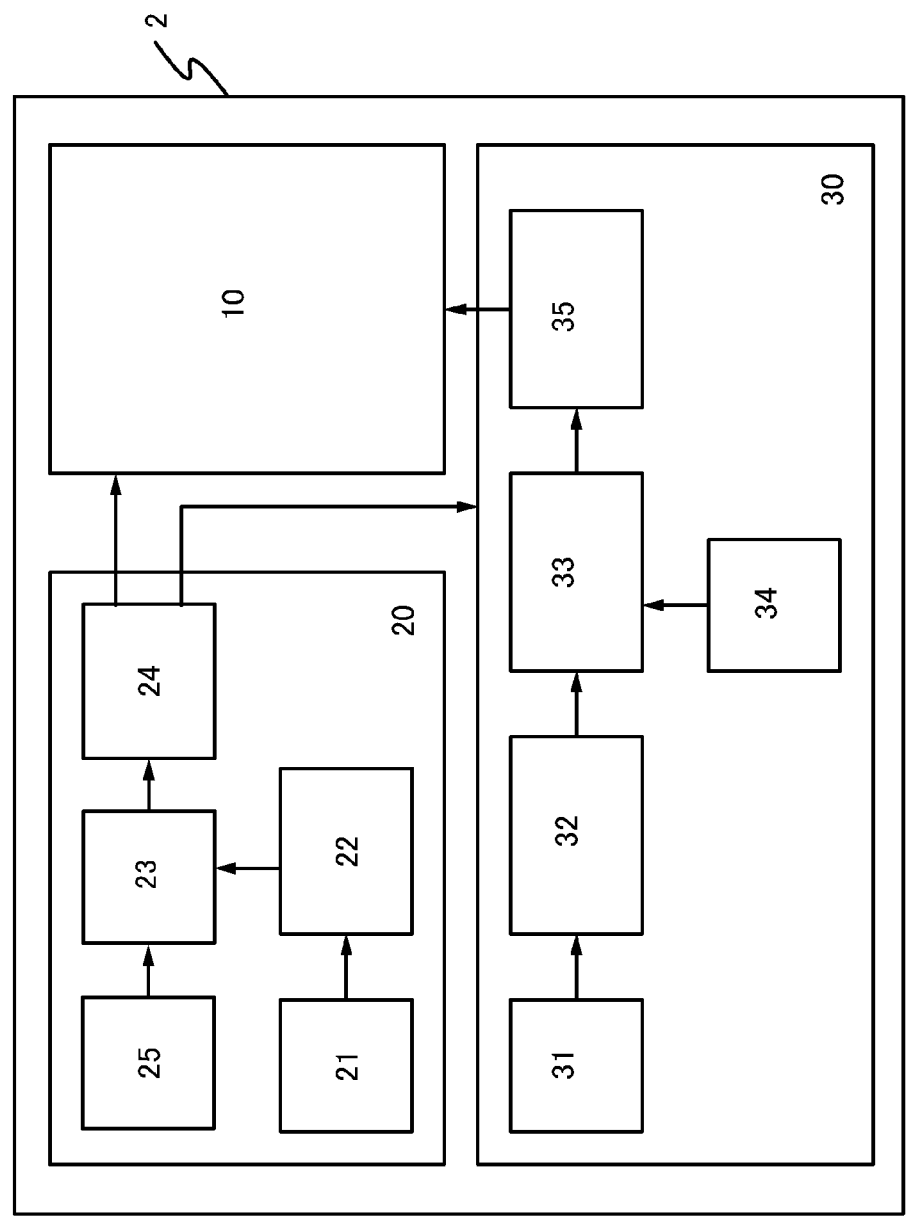
FIG. 5 is a block diagram of a portable electronic device.

FIG. 5 is a block diagram of the portable electronic device of this embodiment. A portable electronic device 2 has a structure in which a solar cell 25 is added to the power source portion 20 of the portable electronic device 1 illustrated in FIG. 1. With the structure including the solar cell 25, when the portable electronic device 2 is exposed to sunlight or illumination light, electricity can be stored in the rechargeable battery 23 with the use of the solar cell 25.

Figure 6:
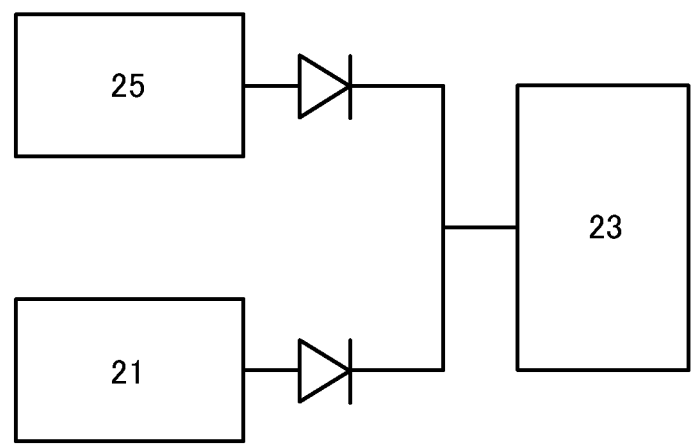
FIG. 6 is a diagram of a connection relation between an antenna, a solar cell, and a rechargeable battery.

In FIG. 6, a connection relation between the antenna, the solar cell, and the rechargeable battery are illustrated. Backflow prevention diodes are provided between the antenna 21 and the rechargeable battery 23 and between the solar cell 25 and the rechargeable battery 23.

A structure example of the portable electronic device including the solar cell is described with reference to FIG. 7.

Figure 7:
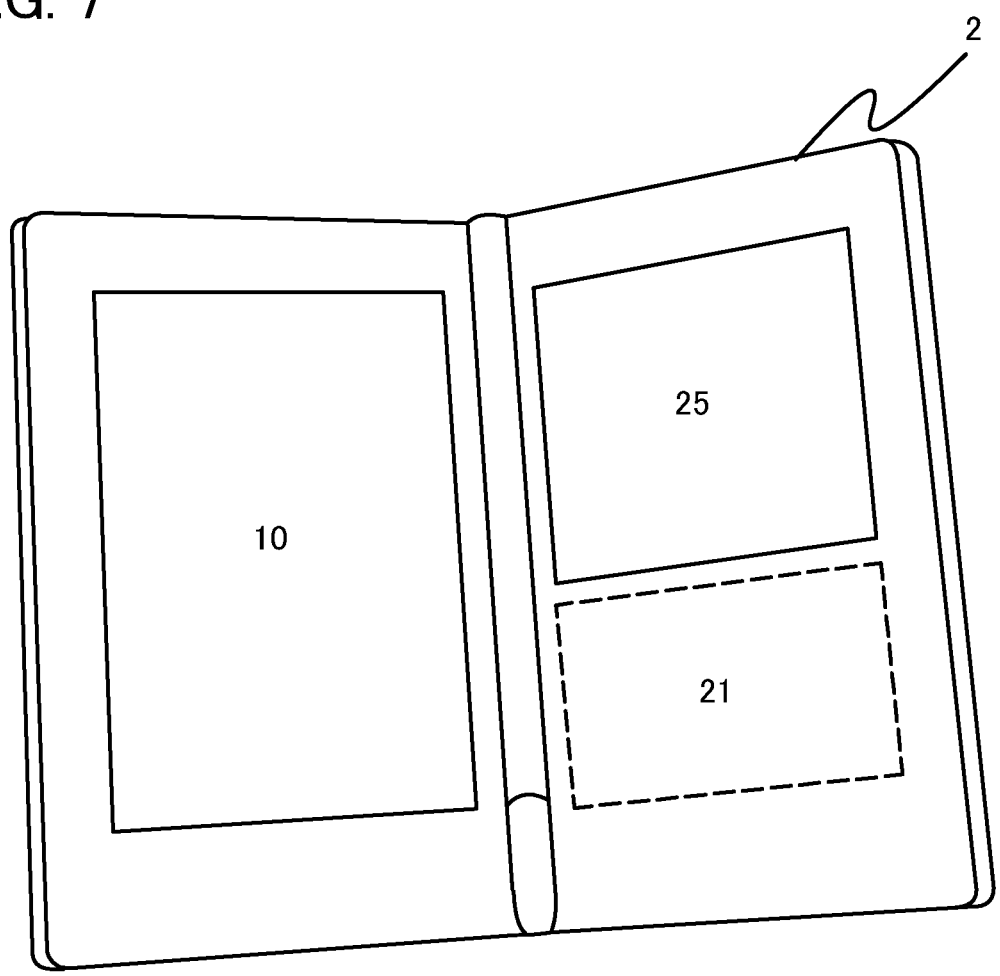
FIG. 7 is a drawing of a structure example of the portable electronic device.

The portable electronic device 2 illustrated in FIG. 7 has a structure in which e-book data is displayed on the display 10 in the state where the portable electronic device 2 is open. Thus, when the solar cell 25 is provided so as to be exposed outside in the state where the portable electronic device 2 is open, the solar cell 25 can perform charge while the e-book data is displayed on the display 10.

A display that does not emit light by itself, such as a reflective liquid crystal display or an electrophoretic display, is particularly suitable for the display 10 because the solar cell 25 can perform charge.

Embodiment 3

In this embodiment, a structure example of a transistor including an intrinsic or substantially intrinsic oxide semiconductor and an example of a manufacturing method thereof are described with reference to FIGS. 8A and 8B and FIGS. 9A to 9E.

Figure 8A:
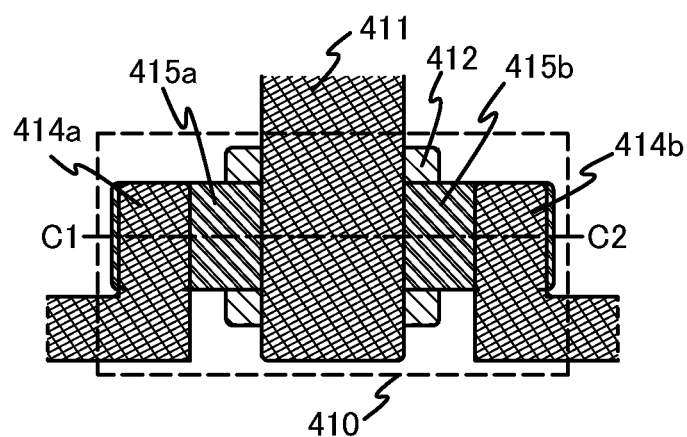
FIGS. 8A and 8B are drawings of a structure example of a transistor.
Figure 8B:
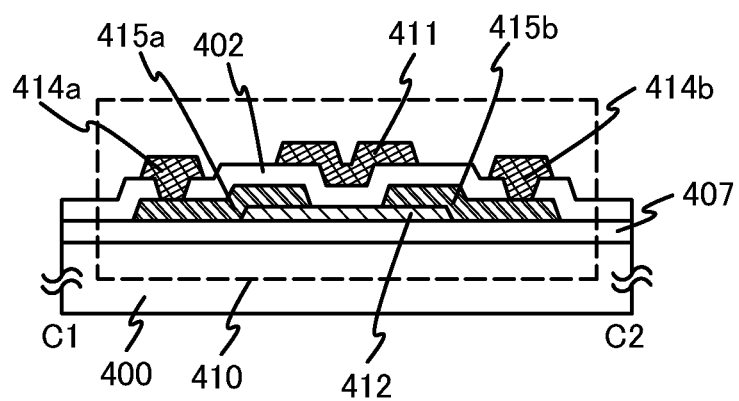

FIGS. 8A and 8B are an example of a plan structure and an example of a cross-sectional structure of a transistor. FIG. 8A is a plan view of a top gate transistor. FIG. 8B is a cross-sectional view of a portion taken along straight line C1-C2 in FIG. 8A.

A transistor 410 includes, over a substrate 400, an insulating layer 407, an oxide semiconductor layer 412, a first electrode 415a, a second electrode 415b, a gate insulating layer 402, and a gate electrode 411. The first electrode 415a is in contact with a wiring layer 414a, and the second electrode 415b is in contact with a wiring layer 414b.

Note that the transistor 410 illustrated in FIGS. 8A and 8B is a single gate transistor; however, the structure of the transistor is not limited thereto. For example, a multi-gate transistor may be applied.

Next, a process of manufacturing the transistor 410 is described with reference to FIGS. 9A to 9E.

First, the insulating layer 407 serving as a base film is formed over the substrate 400. The insulating layer 407 is preferably formed while moisture remaining in a treatment chamber is removed. This is for preventing hydrogen, water, hydroxyl group, hydroxide, or the like from being contained in the insulating layer 407.

Then, an oxide semiconductor layer is formed over the insulating layer 407 by a sputtering method. Note that before the oxide semiconductor layer is formed, the substrate 400 over which the insulating layer 407 is formed is preferably preheated. This is for preventing hydrogen, moisture, and hydroxyl group from being contained in the oxide semiconductor layer as much as possible. By the preheating, impurities such as hydrogen or moisture adsorbed on the substrate 400 are eliminated and exhausted.

As a target for forming the oxide semiconductor layer, a metal oxide target containing zinc oxide as its main component can be used. For example, a target with a composition ratio of $In_2O_3:Ga_2O_3:ZnO=1:1:1$, that is, In:Ga:Zn=1:1:0.5 can be used. Alternatively, a target having a composition ratio of In:Ga:Zn=1:1:1 or In:Ga:Zn=1:1:2 can be used.

Alternatively, a target of a metal oxide such as an In—Sn—Ga—Zn—O-based metal oxide, an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, a Zn—Mg—O-based metal oxide, an Sn—Mg—O-based metal oxide, an In—Mg—O-based metal oxide, an In—O-based metal oxide, an Sn—O-based metal oxide, or a Zn—O-based metal oxide can be used.

Note that as the oxide semiconductor layer, a thin film containing an oxide semiconductor expressed by $InMO_3(ZnO)_m$ (m>0) can be used. Here, M represents one or more metal elements selected from Ga, Al, Mn, and Co. For example, Ga, Ga and Al, Ga and Mn, or Ga and Co can be given as M.

Figure 9A:
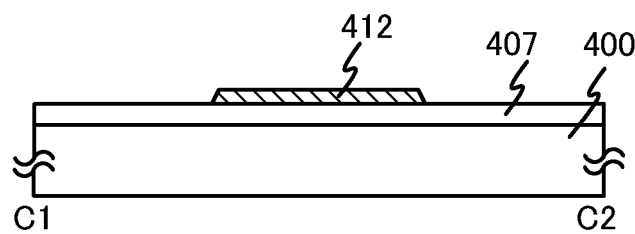
FIGS. 9A to 9E are drawings showing an example of a method for manufacturing the transistor.

The oxide semiconductor layer is processed in a first photolithography step, so that an island-shaped oxide semiconductor layer 412 is formed (see FIG. 9A). After that, in order to remove hydrogen, water, and hydroxyl group from the oxide semiconductor layer 412, the substrate 400 over which the oxide semiconductor layer 412 is formed is put into an electric furnace and subjected to heat treatment. This heat treatment has an effect of dehydration or dehydrogenation on the oxide semiconductor layer 412.

The temperature of the heat treatment is higher than or equal to 400° C. and lower than or equal to 750° C., preferably higher than or equal to 400° C. and less than the strain point of the substrate. In addition, the atmosphere of the heat treatment does not contain water, hydrogen, or the like.

After the heat treatment, successive heat treatment is preferably performed in an oxygen atmosphere or an atmosphere containing nitrogen and oxygen (e.g., nitrogen to oxygen is 4 to 1 in volume ratio). This is for repairing oxygen deficiency generated in the oxide semiconductor layer 412.

Figure 9B:
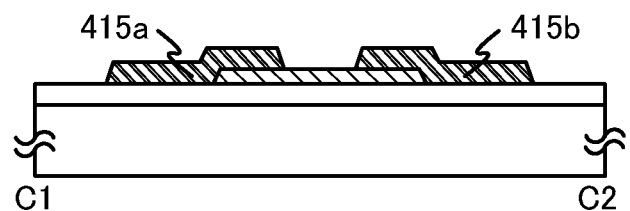

In FIG. 9B, a state where the first electrode 415a and the second electrode 415b are formed over the insulating layer 407 and the oxide semiconductor layer 412 is illustrated. The first electrode 415a functions as one of a source electrode and a drain electrode. The second electrode 415b functions as the other of the source electrode and the drain electrode.

Figure 9C:
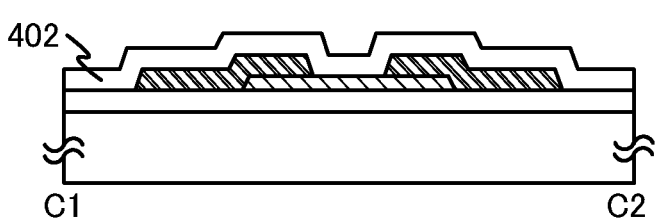

In FIG. 9C, a state where the gate insulating layer 402 is formed over the insulating layer 407, the oxide semiconductor layer 412, the first electrode 415a, and the second electrode 415b is illustrated. Note that it is preferable that hydrogen be not contained in an atmosphere used for forming the gate insulating layer 402.

Figure 9D:
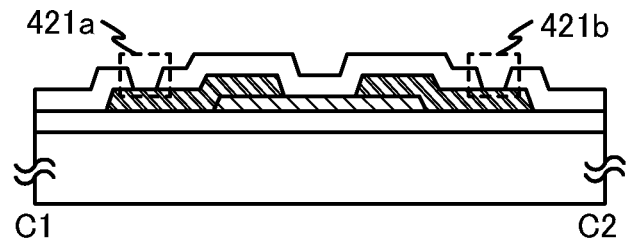

In FIG. 9D, a state where an opening 421a reaching the first electrode 415a and an opening 421b reaching the second electrode 415b are formed by removal of part of the gate insulating layer 402 is illustrated.

Figure 9E:
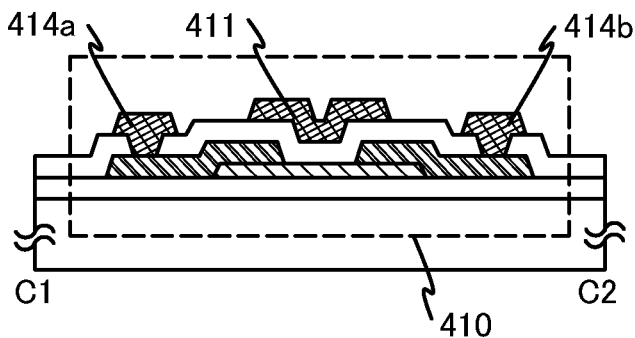

In FIG. 9E, a state where the gate electrode 411, the first wiring layer 414a, and the second wiring layer 414b are formed over the gate insulating layer 402 and in the opening 421a and the opening 421b is illustrated.

In the above manner, a transistor including an intrinsic or substantially intrinsic oxide semiconductor can be manufactured.

This application is based on Japanese Patent Application serial no. 2010-010382 filed with Japan Patent Office on Jan. 20, 2010, the entire contents of which are hereby incorporated by reference.

What is claimed is:

1. A portable electronic device comprising:
a display portion including a first transistor, a channel region of the first transistor comprising a first oxide semiconductor;
a power source portion comprising a rechargeable battery capable of charge by contactless charge; and
a signal processing portion comprising a semiconductor memory device, the semiconductor memory device comprising:
a second transistor, a channel region of the second transistor comprising crystalline silicon;
a third transistor, a channel region of the third transistor comprising a second oxide semiconductor;
a capacitor;
a source line;
a bit line;
a first signal line;
a second signal line; and
a word line,
wherein a gate of the second transistor is electrically connected to one of a source and a drain of the third transistor, a source of the second transistor is electrically connected to the source line, and a drain of the second transistor is electrically connected to the bit line,
wherein a gate of the third transistor is electrically connected to the second signal line, the one of the source and the drain of the third transistor is electrically connected to a first electrode of the capacitor, and the other of the source and the drain of the third transistor is electrically connected to the first signal line, and
wherein the second oxide semiconductor in the channel region of the third transistor has an off-state current of lower than or equal to 1 aA/μm.

2. The portable electronic device according to claim 1, wherein the display portion comprises a reflective liquid crystal display device.

3. The portable electronic device according to claim 1, wherein electric power stored in the rechargeable battery is used in the display portion and the signal processing portion.

4. The portable electronic device according to claim 1, wherein the power source portion comprises a solar cell.

5. The portable electronic device according to claim 1, wherein at least one of the first oxide semiconductor in the channel region of the first transistor and the second oxide semiconductor in the channel region of the third transistor is intrinsic or substantially intrinsic.

6. The portable electronic device according to claim 1, wherein the power source portion further comprises a first antenna having a power-receiving coil for contactless charge, and wherein the signal processing portion comprises a second antenna configured to transmit a request for starting download of data to a server and receive the data sent from the server in response to the request.

7. The portable electronic device according to claim 1, wherein the portable electronic device is an e-book reader.

8. A portable electronic device comprising:
a display portion including a first transistor, a channel region of the first transistor comprising a first oxide semiconductor;
a power source portion comprising a rechargeable battery capable of charge by contactless charge; and
a signal processing portion comprising a semiconductor memory device, the semiconductor memory device comprising:
a second transistor, a channel region of the second transistor comprising crystalline silicon;
a third transistor, a channel region of the third transistor comprising a second oxide semiconductor;
a capacitor; and
first to fifth wirings,
wherein a first terminal of the second transistor is electrically connected to the first wiring, a second terminal of the second transistor is electrically connected to the second wiring, and a gate of the second transistor is electrically connected to a first terminal of the third transistor or one electrode of the capacitor,
wherein a second terminal of the third transistor is electrically connected to the third wiring, and a gate of the third transistor is electrically connected to the fourth wiring,
wherein the other electrode of the capacitor is electrically connected to the fifth wiring, and
wherein the second oxide semiconductor in the channel region of the third transistor has an off-state current of lower than or equal to 1 aA/μm.

9. The portable electronic device according to claim 8, wherein the second oxide semiconductor is the same as the first oxide semiconductor.

10. The portable electronic device according to claim 8, wherein the second oxide semiconductor is different from the first oxide semiconductor.

11. The portable electronic device according to claim 8, wherein the second oxide semiconductor in the channel region is intrinsic or substantially intrinsic.

12. The portable electronic device according to claim 8, wherein the power source portion further comprises a first antenna having a power-receiving coil for contactless charge, and wherein the signal processing portion comprises a second antenna configured to transmit a request for starting download of data to a server and receive the data sent from the server in response to the request.

13. The portable electronic device according to claim 8, wherein the display portion comprises a reflective liquid crystal display device.

14. The portable electronic device according to claim 8, wherein electric power stored in the rechargeable battery is used in the display portion and the signal processing portion.

15. The portable electronic device according to claim 8, wherein the power source portion comprises a solar cell.

16. The portable electronic device according to claim 8, wherein the first oxide semiconductor in the channel region is intrinsic or substantially intrinsic.

17. The portable electronic device according to claim 8, wherein the first oxide semiconductor in the channel region of the first transistor has an off-state current of lower than or equal to 1 aA/μm.

18. The portable electronic device according to claim 8, wherein the portable electronic device is an e-book reader.

19. The portable electronic device according to claim 1, wherein the display portion comprises an electrophoretic display.

20. The portable electronic device according to claim 8, wherein the display portion comprises an electrophoretic display.

21. The portable electronic device according to claim 1, wherein the first oxide semiconductor in the channel region of the first transistor has an off-state current of lower than or equal to 1 aA/μm.

* * * * *